United States Patent [19]
Root et al.

[11] Patent Number: 6,018,192
[45] Date of Patent: Jan. 25, 2000

[54] ELECTRONIC DEVICE WITH A THERMAL CONTROL CAPABILITY

[75] Inventors: Loren Francis Root, McHenry; Maninder Singh Sehmbey, Wheeling, both of Ill.

[73] Assignee: Motorola, Inc., Schaumburg, Ill.

[21] Appl. No.: 09/126,576

[22] Filed: Jul. 30, 1998

[51] Int. Cl.[7] .......................... H01L 23/28; H01L 23/34; H01L 23/473; H01L 23/367
[52] U.S. Cl. .......................... 257/714; 257/712; 257/716; 257/778; 257/777; 257/724; 257/723
[58] Field of Search .................... 257/690, 777, 257/778, 728, 723, 717, 712–713, 721, 724, 730

[56] References Cited

U.S. PATENT DOCUMENTS

| | | | |
|---|---|---|---|
| 3,268,975 | 8/1966 | Emeis | 29/25.3 |
| 5,010,036 | 4/1991 | Calviello et al. | 29/831 |
| 5,198,889 | 3/1993 | Hisano et al. | 257/715 |
| 5,239,200 | 8/1993 | Messina et al. | 257/714 |
| 5,705,850 | 1/1998 | Ashiwake et al. | 257/717 |
| 5,751,062 | 5/1998 | Daikoku et al. | 257/722 |
| 5,763,950 | 6/1998 | Fujisaki et al. | 257/712 |
| 5,777,384 | 7/1998 | Root et al. | 257/715 |

*Primary Examiner*—Alexander Oscar Williams
*Attorney, Agent, or Firm*—Sayed Hossain Beladi

[57] ABSTRACT

An electronic device (10) having a thermal control capability is disclosed. The electronic device includes a substrate (16), a signal conductive region (26) disposed on at least a portion of the substrate, the signal conductive region configured to provide a signal path, and a first semiconductor die (12) having an active surface (18) and a back surface (20). The back surface is configured with a plurality of bubbler cavities positioned to receive a cooling fluid (24). In addition, the first semiconductor die includes a first plurality of solder bumps (30) disposed on the active surface, the first plurality of solder bumps contiguous with, and electrically coupling the active surface to the signal conductive region. Further, an electrically reactive metal region (402) in communication with the signal conductive region is sized to provide a location for real-time iterative tuning of the electronic device.

17 Claims, 2 Drawing Sheets

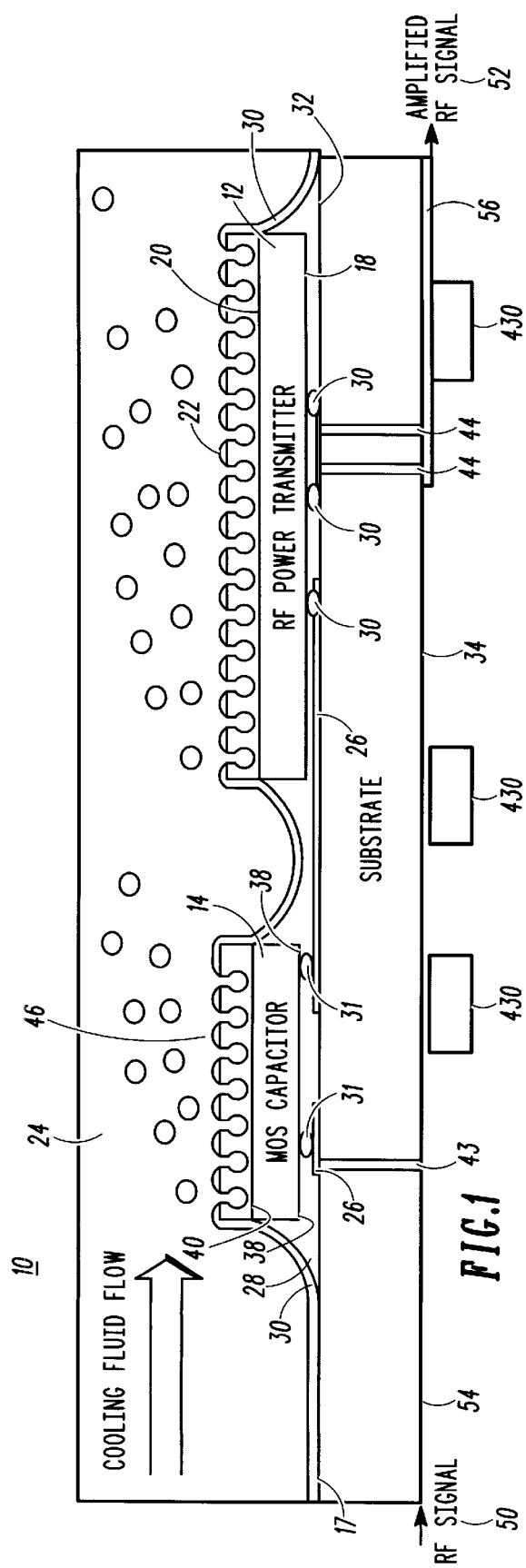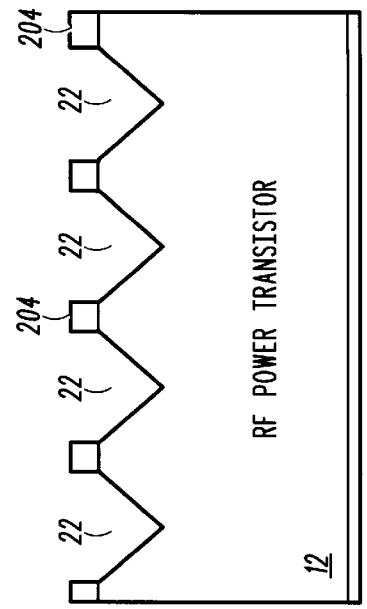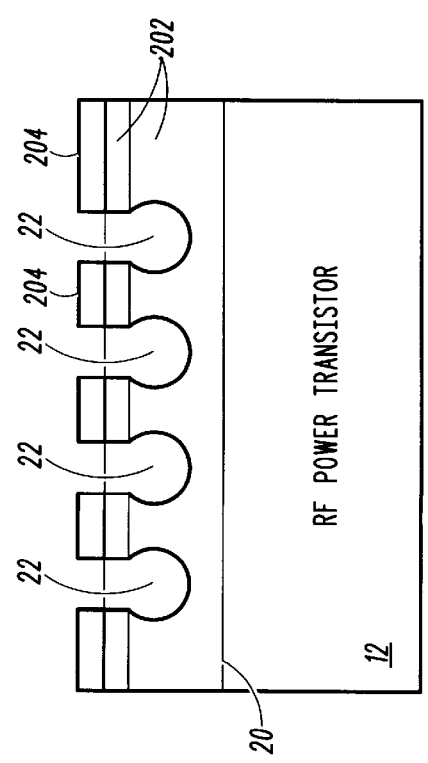

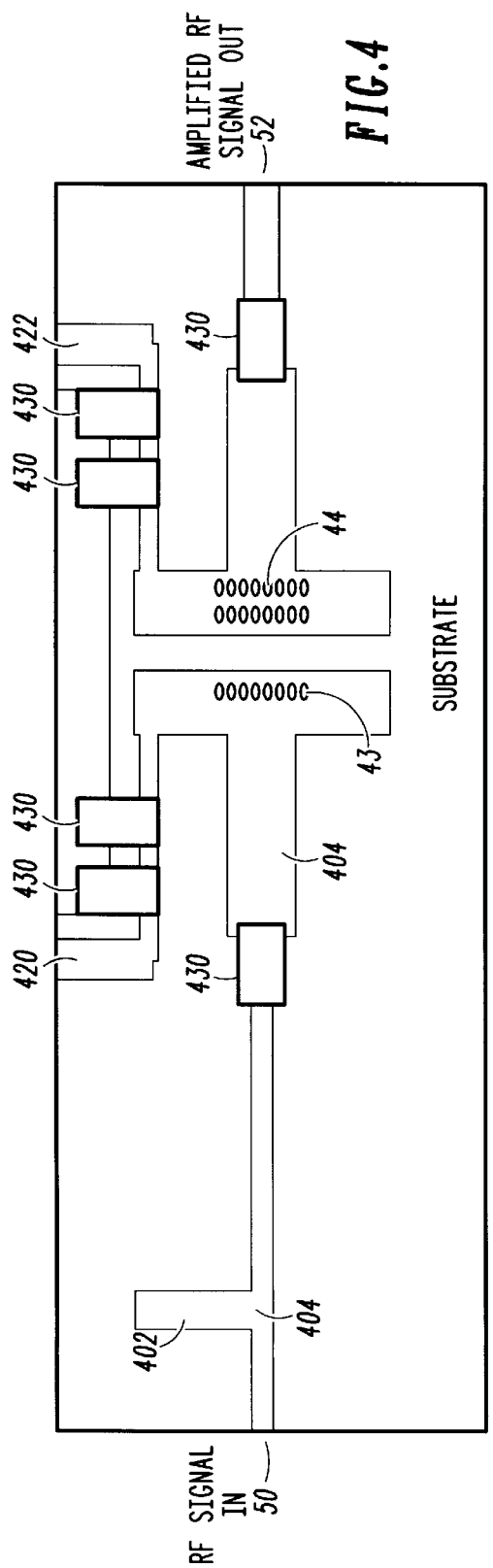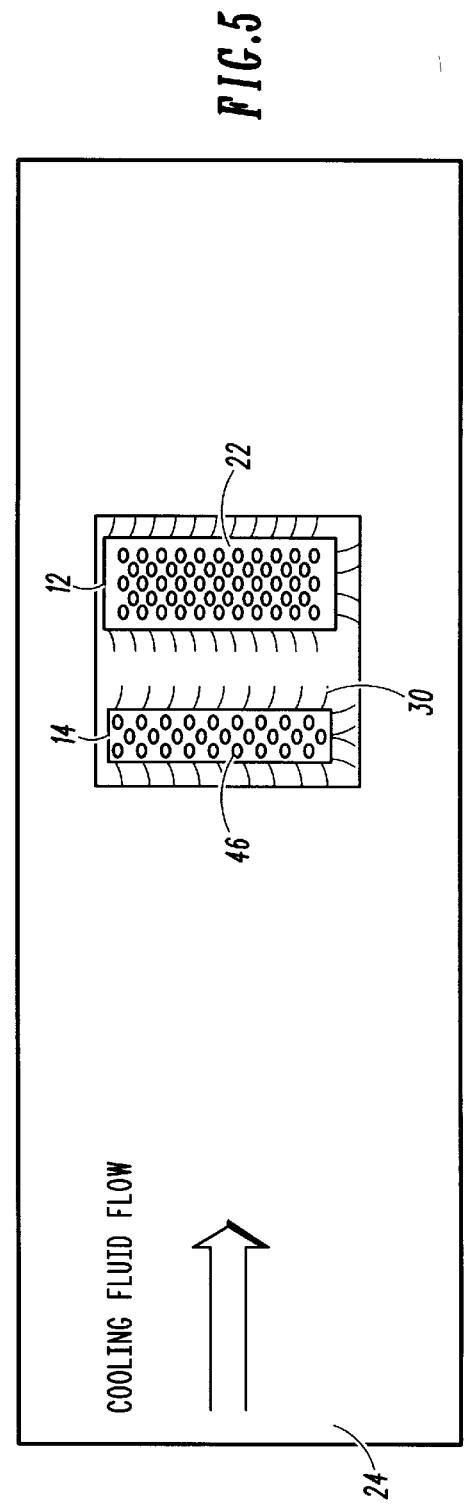

ELECTRONIC DEVICE WITH A THERMAL CONTROL CAPABILITY

FIELD OF THE INVENTION

The present invention relates to electronics, and, more particularly to an electronic device and a method for thermal cooling an electronic device.

BACKGROUND OF THE INVENTION

Often, electronic devices are cooled by natural or forced air convection. Cooling via air convection may be referred to as single-phase cooling. Unfortunately, because of poor thermal capacitance and heat transfer coefficients of air, and because air convection requires moving large volumes of air past the electronic devices or past heat sinks attached to the electronic devices, this method is not desirable for high power applications, such as radio frequency (RF) applications. Moreover, when large heat sinks are utilized, the overall weight and size of electronic equipment may be adversely increased.

One method proposed to overcome the problems of electronic device cooling associated with air convection suggests the use of evaporative spray cooling. Evaporative spray cooling provides a method for heat removal via evaporation of a cooling liquid from an active surface of a semiconductor die. Evaporative spray cooling may be classified as a two-phase cooling method because of its inherent characteristic conversion of a liquid to a gas. Unfortunately, spray cooling some electronic devices may not be desirable or practical. For example, in typical high-power microwave and RF transistors, the characteristic use of wire interconnects presents significant practical application, performance, assembly handling, and manufacturing liabilities when exposed to spray cooling. In addition, liquids generally used for evaporative spray cooling, may cause a change in the dielectric constant of the space surrounding the electronic device and subsequently de-tune the electronic device, causing it to fail.

There is therefore a need for an electronic device which enables two phase cooling, eliminates the need for wire bonding, allows iterative real-time tuning, and which may be used in high powered applications such as RF assemblies.

BRIEF DESCRIPTION OF THE DRAWINGS

FIG. 1 is a side view of an electronic device according to a preferred embodiment of the present invention.

FIG. 2 is a side view of a semiconductor die 200 which includes a plurality of bubbler cavities disposed on a back surface, according to the preferred embodiment of the present invention.

FIG. 3 is an alternate side view of a semiconductor die 300 which includes a plurality of bubbler cavities formed directly into semiconductor die 30.

FIG. 4 is a bottom view of the electronic device, according to the preferred embodiment of the present invention.

FIG. 5 is a top view of the electronic device, according to the preferred embodiment of the present invention.

DETAILED DESCRIPTION OF THE PREFERRED EMBODIMENT

Generally speaking, a combination of elements including implementation of two phase cooling via the use of bubbler cavities, flip-chip style mounting assembly techniques, and polymeric underfill with backplane grounding deposition, provides an efficient thermal cooling means for an electronic device in a high power RF electronic application. Also, use of an electrically reactive metal region in communication with a RF input metal portion of the electronic device, allows real-time iterative tuning of the electronic device. In addition, a method for fabricating the electronic device according to the preferred embodiment of the present invention, is also disclosed.

Turning now to the drawings, wherein like numerals designate like components, FIG. 1 is a side view of an electronic device according to a preferred embodiment of the present invention. As shown, electronic device 10 is a high power radio frequency (RF) assembly. It is contemplated the electronic device 10 may be an RF power amplifier or another type of device such as a power supply regulator, or an integrated micro-controller. Electronic device 10 includes a RF power transistor semiconductor die 12 and a matching metal oxide semiconductor (MOS) capacitor semiconductor die 14, both disposed on a substrate 16. Substrate 16 may be ceramic or another suitable material such as glass-filled epoxy, teflon, or plastic. RF power transistor semiconductor die 12 is referred to herein as transistor 12, and matching metal oxide semiconductor (MOS) capacitor semiconductor die 14 is referred to herein as capacitor 14. In addition, electronic device 10 may be configured in a variety of ways, for example, it may not have a capacitor or it may contain any number of additional capacitors arranged about the transistor.

Substrate 16 has a top side 32 and a bottom side 34 (discussed in connection with FIG. 4). A ground metal layer 30 consisting of a ground plane is disposed on a portion of top side 32 as well as on transistor 12 and capacitor 14. In addition, a signal conductive region 26, consisting of a number of runners and die mounting pads, is strategically disposed on additional portions of top side 32 in order to provide an electrically conductive surface on top side 32 for transistor 12 and capacitor 14 mounting and interconnection.

Transistor 12 has an active surface 18 and a back surface 20 and is electrically coupled to signal conductive region 26. Electrical coupling between transistor 12 and signal conductive region 26 is achieved via a first plurality of solder bumps 30, flip-chip bonded to active surface 18, using well known soldering techniques. Similarly, capacitor 14 has an active surface 38 and a back surface 40 and is electrically coupled to signal conductive region 26. Electrical coupling between capacitor 14 and signal conductive region 26 is achieved via a second plurality of solder bumps 31, flip-chip bonded to active surface 38. In addition, ground metal layer 30 is disposed on back surfaces 20 and 40.

It is contemplated that the use of first plurality of solder bumps 30 and second plurality of solder bumps 31 by means of a single step soldering process commonly referred to as flip-chip mounting, eliminates reliability problems associated with multiple bonding chip-and-wire technology such as broken or bent wires. In addition, flip chip mounting, or bonding, reduces the direct material cost of total fabrication process steps and circuitry space requirements by eliminating a first level of component packaging. Moreover, in radio frequency and microwave circuit applications where chip-to-assembly wire bonds play an integral part of circuit tuning and performance, much of the circuit tuning variation can be eliminated by replacing interacting wires of variable dimension, which are difficult to model, with flip chip style solder contacts.

However, in high power applications, for example radio frequency and microwave circuits such as electronic device 10, an efficient method of cooling is required in order to preclude problems associated with overheating. According to the preferred embodiment of the present invention, efficient cooling is achieved using a two-phase cooling technique. Two-phase cooling is enabled through the use of bubbler cavities in contact with a cooling fluid. Back surface 20 of transistor 12 is configured with a first plurality of bubbler cavities 22 positioned to receive a cooling fluid 24. Similarly, back surface 40 of capacitor 14 is configured with a second plurality of bubbler cavities 46 positioned to receive a cooling fluid 24. The coolant fluid may be any suitable liquid such as water or it may be a dielectric coolant, such coolants being well known and widely available. One example of a suitable coolant is 3M's Flourinert™ dielectric fluid, available from 3M, order number FC-72. Another perflourocarbon fluid similar to 3M's Flourinert™ dielectric fluid is available from Ausimont Galden®.

Use of first plurality of bubbler cavities 22 and second plurality of bubbler cavities 46 and cooling fluid 24, enables on-chip cooling via bi-state "pool boiling." As a consequence of effective thermal management via pool boiling, the use of flip chip assembly methods may be applied to high power applications. Without the addition of pool boiling capability, the use of flip chip assembly methods may otherwise not be suitable due to the self-heating of electronic device 10. Pool boiling, or two phase cooling exploits the need for an additional amount of heat in order to change cooling fluid 24 from a liquid state into a vapor state. The energy required for the change is commonly referred to as the molar heat of vaporization. By forming small, high periphery bubbler site cavities on back surface 20 and back surface 40, the process of converting a liquid into a vapor is enhanced thereby further enabling a heat transfer from electronic device 10 to cooling fluid 24. Two phase cooling represents a substantial improvement in thermal management over that which may be provided by prior art, single phase cooling.

FIG. 2 is a side view of a semiconductor die 200 which includes a plurality of bubbler cavities disposed on a back surface, for example back surface 20 configured with first plurality of bubbler cavities 22, according to the preferred embodiment of the present invention. Assembly 200 includes a plurality of differential etch rate metal layers 202 coupled to back surface 20. First plurality of bubbler cavities 22 may be formed directly into plurality of differential etch rate metal layers 202 via a micro-etching technique. Plurality of differential etch rate back metal layers 202 may include a combination of metal layers such as copper and aluminum, or any other suitable combination. It is contemplated that plurality of differential etch rate metal layers 202 are selected such that the metal layers will etch at different rates, yielding a desired bubbler cavity shape when exposed to a suitable acid such as hydrochloric acid. Further, a photo imagable etch resist layer 204 disposed on top of plurality of differential etch rate metal layers 202, may be used to resist chemical etching and therefore provide a predetermined surface design, or template for the formation of bubbler cavities.

Alternatively, bubbler cavities 22 may be formed directly on transistor 12 and capacitor 14 using existing photolithographic etching techniques. FIG. 3 is an alternate side view of a semiconductor die 300 and includes a plurality of bubbler cavities formed directly into semiconductor die 300. In the alternate embodiment, photo imageable etch resist layer 204 is coupled directly onto back surface 20 of transistor 12. A predetermined configuration of bubbler cavities results from subsequent exposure of transistor 12 to a suitable acid using a suitable method.

It is also contemplated that bubbler cavities could be formed using a third method (not shown). The third method includes forming bubbler cavities 22 in a metal heat spreading block comprised of plurality of differential etch rate metal layers 202. The metal heat spreading block could then be attached to transistor 12 and capacitor 14 either by known soldering techniques or by epoxy. Formation of bubbler cavities 22 through use of the third method may be accomplished using well known chemical milling or casting techniques. By utilizing the third method, a heat flux capacity as well as the size of the bubbler cavities may be increased over that which is available via the previously described method in which the bubbler cavities are formed directly on transistor 12 and capacitor 14. The increased bubbler cavity periphery area results in an increased available surface area over which heat may be dissipated.

Returning to FIG. 1, a polymeric underfill 28 deposited in a continuous fashion across the top side of device 10, has a variable thickness which substantially fills a space between back surfaces 20 and 40 of transistor 12 and capacitor 14 correspondingly, and substrate 16. The variable thickness allows first and second plurality of bubbler cavities 22 and 46 to have access to cooling fluid 24 while at the same time providing a barrier between the active surfaces of transistor 12 and capacitor 14, and cooling fluid 24. In addition, polymeric underfill 28 provides a support structure for ground metal layer 30.

Ground metal layer 30 disposed on polymeric underfill 28 provides an electrical connection between the grounded surface of substrate 16 and a common terminal of transistor 20 and capacitor 40. Ground metal layer 30 covers back surfaces 20 and 40 of corresponding transistor 12 and capacitor 14 as well as a concave fillet created by polymeric underfill 28 between transistor 12 and capacitor 14 and portions of substrate 16. Ground metal layer 30 may be a sputtered metal film such as copper, aluminum, titanium, chrome, or nickel. It is contemplated that ground metal layer 30 may also be formed by means of a conductive epoxy that is screen printed over electronic device 10 or dispensed on electronic device 10. Examples of such a conductive epoxy may include metal filled epoxies or urethanes filled with copper, nickel, silver, gold, stainless steel, or other suitable metals.

A second array of conductive vias 43 is perpendicularly disposed in substrate 16. Second array of conductive vias 43 provides a through-put capability to signal conductive region 26 for a radio frequency signal 50. An RF input metal portion 54 disposed on bottom side 34 (discussed in connection with FIG. 4), provides a pathway for radio frequency signal 50 to access second array of conductive vias 43. For example, radio frequency signal 50 transmitted into electronic device 10 via RF input metal portion 54, will be electrically conducted to capacitor 14 via second array of conductive vias 43, through signal conductive region 26 and second plurality of solder bumps 31. Similarly, a first array of conductive vias 44 is perpendicularly disposed in substrate 16. As depicted, first array of conductive vias 44 provides a through-put capability for a radio frequency signal 50 received via signal conductive region 26 to an RF output metal portion 56 disposed on bottom side 34. For example, radio frequency signal 50 transmitted to transistor 12 from capacitor 14 via signal conductive region 26, will be electrically conducted to RF output metal potion 56. Assuming that electronic device 10 is a RF amplifier circuit, radio frequency signal 50 appears at RF output metal portion 56 as an amplified signal.

Thus, a combination of elements including implementation of two phase cooling via the use of bubbler cavities, flip-chip style mounting assembly techniques, and polymeric underfill with backplane grounding deposition, provides efficient thermal cooling in high power RF electronic devices such as electronic device 10.

FIG. 4 is a bottom view of electronic device 10, according to the preferred embodiment of the present invention. A circuit metalization footprint 404 is disposed on bottom side 34 of substrate 16. Circuit metalization footprint 404 is preferably a metalized polymide. Circuit metalization footprint 404 provides electrical conductivity between a plurality of surface mounted chip components 430, which may be for example capacitors, inductors, or resistors. It is contemplated that plurality of surface mounted chip components 430 may be mounted to electronic device 10 via well-known pick-and place methods or any other suitable method. In addition circuit metalization footprint 404 including RF input metal portion 54 and RF output metal portion 56, provides electrical conductivity via first and second array of conductive vias 43 to transistor 12 and capacitor 14. Further, an electrically reactive metal region 402 in communication with signal conductive region 26 via circuit metalization footprint 404, is disposed on bottom side 34. Electrically reactive metal region 402 provides a capability for real-time iterative tuning of electronic device 10. Real-time iterative tuning may be accomplished using for example, algorithmically automated laser tuning or manual tuning. In addition, a first direct current input 422 is electrically coupled to circuit metalization footprint 404 to allow current adjustment capability for transistor 12. Similarly, a second direct current input 420 is electrically coupled to circuit metalization footprint 404 to allow current adjustment capability for capacitor 14.

FIG. 5 is a top view of electronic device 10, according to the preferred embodiment of the present invention. FIG. 5. further illustrates the thermal cooling provided to electronic device 10 via exposure of first plurality of bubbler cavities 22 and second plurality of bubbler cavities 46 to cooling fluid 24 as it flows across top side 32 of electronic device 10.

A method for fabricating electronic device 10 according to the preferred embodiment of the present invention is as follows. A substrate 16 including a top side 32 having a signal conductive region 26, and a bottom side 34, is provided. At least one semiconductor die 12 is disposed on substrate 16, the semiconductor die including an active surface 18 and a back surface 20 configured with a plurality of bubbler cavities 22. Plurality of bubbler cavities 22 are formed via chemically etching a assembly of layers of a suitable material, disposed on the back surface of semiconductor die 12. The assembly of layers preferably include a photo imageable etch resist layer 204 disposed on a plurality of differential etch rate back metal layers 202. Photo imageable etch resist layer 204 is formed to provide a template for plurality of bubbler cavities 22.

A plurality of solder bumps 30 is disposed on active surface 18 to provide electrical coupling of active surface 18 to signal conductive region 26. Transistor 12 is flip-chip bonded to signal conductive region 26. An electrically reactive metal region 402 in communication with signal conductive region 26 is also provided. Electrically reactive metal region 402 is sized to allow real-time iterative tuning of electronic device 10.

Transistor 12 is partially enclosed to allow bubbler cavity exposure only, by a polymeric underfill 28 disposed via automated extruding equipment. Partial enclosure of polymeric underfill 28 is accomplished by ensuring that polymeric underfill 28 is disposed on a portion of the signal conductive region which is not contiguous with solder bumps 30, and on an exposed portion of substrate 16, proximate to and under transistor 12. Next, a ground metal layer 30 is disposed on polymeric underfill 28 as well as any remaining exposed portion of top side 32, including plurality of bubbler cavities 22. Ground metal layer 30 provides an electrical grounding for electronic device 10. Electronic device 10 is passed through a solder screening process, a pick-and-place line (to attach plurality of surface mounted chip components 430), and a reflow solder process. Automated laser tuning via electrically reactive metal region 402 or manual tuning techniques are then employed.

Upon completion of assembly of electronic device 10 according to the preferred embodiment of the present invention, a cooling fluid 24 passed across the plurality of bubbler cavities is nucleated and thermal cooling of electronic device 10 is achieved.

While the invention has been particularly shown and described with reference to a number of embodiments, it will be understood by those skilled in the art that various changes in form and details may be made therein without departing from the spirit and scope of the invention.

What we claim is:

1. An electronic device, comprising:
   a substrate;
   a signal conductive region disposed on at least a portion of the substrate, the signal conductive region configured to provide a signal path;
   a first semiconductor die disposed on the signal conductive region, the first semiconductor die having an active surface and a back surface, the back surface configured with a plurality of bubbler cavities positioned to receive a cooling fluid;
   a plurality of solder bumps disposed on the active surface, the plurality of solder bumps contiguous with, and electrically coupling the active surface to the signal conductive region; and
   an electrically reactive metal region in communication with the signal conductive region, the electrically reactive metal region providing a location for real-time iterative tuning of the electronic device.

2. The electronic device according to claim 1, further comprising:
   a second semiconductor die in communication with the electrically reactive metal region.

3. The electronic device according to claim 2, wherein the second semiconductor die comprises a capacitor.

4. The electronic device according to claim 1, wherein the plurality of bubbler cavities further comprises:
   a plurality of metal layers coupled to the back surface of the first semiconductor die, the plurality of metal layers formed to create the plurality of bubbler cavities.

5. The electronic device according to claim 1, further comprising:
   a polymeric underfill disposed on a portion of the signal conductive region not contiguous with the solder bumps, and
   an exposed portion of the substrate proximate to and under the first semiconductor die, and
   having a thickness necessary to surround the first semiconductor die while allowing a total exposure of the plurality of bubbler cavities to the cooling fluid.

6. The electronic device according to claim 5, further comprising:
   a ground metal layer disposed on the polymeric underfill, the back surface of the first semiconductor die, and a back surface of the second semiconductor die, the ground metal layer providing an electrical grounding for the electronic device.

7. The electronic device according to claim 1, wherein the electrically reactive metal region is sized to allow laser tuning of the electronic device.

8. The electronic device according to claim 1, wherein the substrate comprises ceramic.

9. The electronic device according to claim 1, wherein the first semiconductor device comprises a radio frequency power transistor.

10. An electronic device, comprising:

a substrate having a top side and a bottom side;

a signal conductive region disposed on at least a portion of the top side, the signal conductive region configured to provide a portion of an electrical pathway for a radio frequency signal;

a first radio frequency component disposed on a first portion of the signal conductive region, the first radio frequency component having an first active surface and a first back surface, the first back surface configured with a first plurality of bubbler cavities positioned to receive a cooling fluid;

a first plurality of solder bumps flip-chip bonded to the first active surface, the first plurality of solder bumps providing electrical coupling of the first active surface to the signal conductive region; and an electrically reactive metal region disposed on a portion of the bottom side and in communication with the signal conductive region, the electrically reactive metal region configured to allow real-time iterative tuning of the first radio frequency component.

11. The electronic device according to claim 10, further comprising:

a second radio frequency component disposed on a second portion of the signal conductive region, the second radio frequency component having an second active surface and a second back surface, the second back surface configured with a second plurality of bubbler cavities positioned to receive the cooling fluid, and the second radio frequency component in communication with the electrically reactive metal region; and a second plurality of solder bumps flip-chip bonded to the second active surface, the second plurality of solder bumps providing electrical coupling of the second active surface to the signal conductive region.

12. The electronic device according to claim 11, wherein the electrically reactive metal region is configured to allow real-time iterative tuning of the second radio frequency component.

13. The electronic device according to claim 12, wherein the first and second plurality of bubbler cavities comprise:

a plurality of differential etch rate back metal layers disposed on the first and second back surfaces of the first and second radio frequency components, each of the plurality of differential etch rate back metal layers having a property of being chemically etched at different rates to yield a desired shape; and a photo imagable etch resist layer disposed on a top surface of the plurality of differential etch rate back metal layers, the photo imagable etch resist layer forming a bubbler cavity template therethrough, and having a property of resisting chemical etching.

14. The electronic device according to claim 12, wherein the first and second plurality of bubbler cavities comprise:

a photo imagable etch resist layer disposed on the first and second back surfaces of the first and second radio frequency components to create a bubbler cavity template therethrough, and having a property of resisting chemical etching.

15. The electronic device according to claim 12, further comprising:

a polymeric underfill disposed on an exposed portion of the top side of the substrate and an exposed portion of the signal conductive region, the polymeric underfill having a first thickness equivalent to a thickness between the first active surface and the exposed portion of the top side of the substrate, the first thickness allowing an exposure of the first plurality of the bubbler cavities to the cooling fluid, and having a second thickness equivalent to a thickness between the second active surface and the exposed portion of the top side of the substrate, the second thickness allowing an exposure of the second plurality of the bubbler cavities to the cooling fluid, and having a continuous deposition thereon.

16. The electronic device according to claim 15, further comprising:

a conductive ground metal layer disposed on the polymeric underfill and a remaining portion of the substrate, the ground metal layer providing an electrical grounding for the electronic device.

17. The electronic device according to claim 16, further comprising:

a circuit metalization footprint dosposed on the bottom side, the circuit metalization footprint having a RF output metal portion for receiving the radio frequency signal, a RF output metal portion for outputting an amplified radio frequency signal, and a first and second direct current input for applying a direct current to the circuit metalization footprint;

a plurality of chip components electrically coupled to the circuit metalization footprint;

a first array of conductive vias perpedicularly disposed in the substrate between the circuit metalization footprint and the signal conductive regions, the first array of conductive vias providing a through-put capability for the radio frequency signal to the first radio frequency component; and a second array of conductive vias perpedicularly disposed in the substrate between the circuit metalization footprint and the signal conductive regions, the second array of conductive vias providing a through-put capability for the radio frequency signal to the second radio frequency component.

* * * * *

UNITED STATES PATENT AND TRADEMARK OFFICE
CERTIFICATE OF CORRECTION

PATENT NO : 6,018,192
DATED : January 25, 2000
INVENTOR(S) : Loren Francis Root; Maninder Singh Shembey It is certified that error appears in the above-identified patent and that said Letters Patent is hereby corrected as shown below:

In column 8, line 39, please delete the word "output" and insert --input--.

Signed and Sealed this

Twentieth Day of February, 2001

Attest:

NICHOLAS P. GODICI

Attesting Officer

Acting Director of the United States Patent and Trademark Office